(12) United States Patent
Kim et al.

(10) Patent No.: US 9,355,931 B2
(45) Date of Patent: May 31, 2016

(54) PACKAGE-ON-PACKAGE DEVICES AND METHODS OF MANUFACTURING THE SAME

(71) Applicants: Jongkook Kim, Hwaseong-si (KR); Jangwoo Lee, Cheonan-si (KR); Kyoungsei Choi, Yongin-si (KR); Sayoon Kang, Seoul (KR); Donghan Kim, Osan-si (KR); Hwanggil Shim, Seoul (KR)

(72) Inventors: Jongkook Kim, Hwaseong-si (KR); Jangwoo Lee, Cheonan-si (KR); Kyoungsei Choi, Yongin-si (KR); Sayoon Kang, Seoul (KR); Donghan Kim, Osan-si (KR); Hwanggil Shim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/516,764

(22) Filed: Oct. 17, 2014

(65) Prior Publication Data

US 2015/0206869 A1    Jul. 23, 2015

(30) Foreign Application Priority Data

Jan. 23, 2014    (KR) ........................ 10-2014-0008475

(51) Int. Cl.
| | |
|---|---|
| *H01L 21/00* | (2006.01) |
| *H01L 23/36* | (2006.01) |
| *H01L 23/42* | (2006.01) |
| *H01L 23/498* | (2006.01) |
| *H01L 25/10* | (2006.01) |
| *H01L 23/552* | (2006.01) |

(52) U.S. Cl.
CPC ............... *H01L 23/36* (2013.01); *H01L 23/42* (2013.01); *H01L 23/49816* (2013.01); *H01L 25/105* (2013.01); *H01L 23/552* (2013.01); *H01L 2224/32145* (2013.01); *H01L 2224/32225* (2013.01); *H01L 2224/48091* (2013.01); *H01L 2224/48227* (2013.01); *H01L 2224/73253* (2013.01); *H01L 2224/73265* (2013.01); *H01L 2225/107* (2013.01); *H01L 2225/1023* (2013.01); *H01L 2225/1058* (2013.01); *H01L 2225/1088* (2013.01); *H01L 2225/1094* (2013.01); *H01L 2924/0002* (2013.01); *H01L 2924/15311* (2013.01)

(58) Field of Classification Search
None
See application file for complete search history.

(56) References Cited

U.S. PATENT DOCUMENTS

| | | | | |
|---|---|---|---|---|
| 5,804,872 | A | * | 9/1998 | Miyano ............... H01L 23/3672 257/668 |
| 6,223,815 | B1 | | 5/2001 | Shibasaki |
| 6,646,334 | B2 | | 11/2003 | Hur |
| 6,864,120 | B2 | | 3/2005 | Murayama et al. |
| 6,895,666 | B2 | | 5/2005 | Hong et al. |
| 6,909,176 | B1 | | 6/2005 | Wang et al. |
| 7,663,883 | B2 | | 2/2010 | Shirakami et al. |
| 7,737,550 | B2 | | 6/2010 | MacQuarrie et al. |

(Continued)

FOREIGN PATENT DOCUMENTS

| | | |
|---|---|---|
| JP | 2013-081971 A | 5/2013 |
| KR | 2006-0035070 A | 4/2006 |

(Continued)

*Primary Examiner* — Angel Roman
(74) *Attorney, Agent, or Firm* — Myers Bigel & Sibley, P.A.

(57) ABSTRACT

Package-on-package (POP) devices and methods of manufacturing the POP devices are provided. In the POP devices, a thermal interface material layer disposed between lower and upper semiconductor packages may contact about 70% or greater of an area of a top surface of a lower semiconductor chip. According to methods, the upper semiconductor package may be mounted on the lower semiconductor chip using a weight.

14 Claims, 12 Drawing Sheets

(56) References Cited

U.S. PATENT DOCUMENTS

| | | |
|---|---|---|
| 7,786,600 B2 | 8/2010 | Kang |
| 7,816,183 B2 | 10/2010 | Kawata |
| 7,838,979 B2 | 11/2010 | Oh |
| 7,851,894 B1* | 12/2010 | Scanlan .................. 257/659 |
| 7,960,827 B1 | 6/2011 | Miller, Jr. et al. |
| 8,034,660 B2 | 10/2011 | Takahashi |
| 8,154,135 B2 | 4/2012 | Kim et al. |
| 8,198,136 B2 | 6/2012 | Oh |
| 8,253,256 B2 | 8/2012 | Jo |
| 8,299,592 B2 | 10/2012 | Suh et al. |
| 8,378,477 B2 | 2/2013 | Do et al. |
| 8,384,203 B2 | 2/2013 | Toh et al. |
| 8,462,511 B2 | 6/2013 | Lee |
| 8,541,289 B2 | 9/2013 | Hong et al. |
| 8,698,317 B2 | 4/2014 | Seo et al. |
| 2003/0197260 A1* | 10/2003 | Nishimura et al. ........ 257/686 |
| 2005/0062152 A1 | 3/2005 | Tsai |
| 2005/0184377 A1* | 8/2005 | Takeuchi et al. ........... 257/686 |
| 2006/0043553 A1 | 3/2006 | Yang et al. |
| 2006/0278989 A1* | 12/2006 | Trezza .................. 257/773 |
| 2006/0278991 A1 | 12/2006 | Kwon |
| 2007/0096287 A1* | 5/2007 | Araki et al. ............... 257/686 |
| 2009/0102002 A1 | 4/2009 | Chia et al. |
| 2011/0176280 A1* | 7/2011 | Lee ........................ 361/721 |
| 2011/0215448 A1 | 9/2011 | Cho |
| 2012/0012991 A1 | 1/2012 | Chandrasekaran |
| 2012/0061854 A1* | 3/2012 | Chow et al. ............... 257/778 |
| 2012/0074586 A1* | 3/2012 | Seo et al. .................. 257/774 |
| 2012/0280404 A1* | 11/2012 | Kwon et al. ............... 257/777 |
| 2013/0119560 A1 | 5/2013 | Toh et al. |
| 2013/0234320 A1* | 9/2013 | Lu .................... H01L 24/94 257/737 |

FOREIGN PATENT DOCUMENTS

| | | |
|---|---|---|
| KR | 2012-0123928 | 11/2012 |
| KR | 2013-0035805 A | 4/2013 |

\* cited by examiner

PACKAGE-ON-PACKAGE DEVICES AND METHODS OF MANUFACTURING THE SAME

CROSS-REFERENCE TO RELATED APPLICATION

This U.S. non-provisional patent application claims priority under 35 U.S.C §119 to Korean Patent Application No. 10-2014-0008475, filed on Jan. 23, 2014, in the Korean Intellectual Property Office, the disclosure of which is hereby incorporated by reference in its entirety.

BACKGROUND

The present inventive concepts relate to a package-on-package device and a method of manufacturing the same.

High-functional, high-speed and small electronic components have been increasingly demanded with the development of an electronic industry. Various semiconductor mounting techniques have been developed to satisfy these demands. For example, a plurality of semiconductor chips may be mounted on one package substrate, and a package may be stacked on another package to form a package-on-package (POP) device. However, since each package of the POP device includes a package substrate and a semiconductor chip, a total thickness of the POP device may increase. In addition, it may be difficult to release heat generated from the semiconductor chips in the POP device, and thus, false operation and/or speed delay of the semiconductor chips in the POP device may be caused.

SUMMARY

Some embodiments of the present inventive concepts may provide a package-on-package (POP) device capable of effectively release heat.

Some embodiments of the present inventive concepts may also provide a method of manufacturing the POP device.

According to some embodiments of the present inventive concept, a POP device may include a lower semiconductor package and an upper semiconductor package disposed on the lower semiconductor package. The lower semiconductor package may include a lower package substrate and a lower semiconductor chip mounted on the lower package substrate. The upper semiconductor package may include an upper package substrate and an upper semiconductor chip mounted on the upper package substrate. The POP device may also include a thermal interface material layer disposed between the lower semiconductor chip and the upper package substrate. A contact area of the thermal interface material layer contacting a top surface of the lower semiconductor chip may be equal to or greater than 70% of an area of the top surface of the lower semiconductor chip.

In some embodiments, the thermal interface material layer may have a thermal conductivity of about 2 W/m·K or greater.

According to some embodiments of the present inventive concepts, a method of manufacturing a POP device may include applying a thermal interface material composition on a lower semiconductor package including a lower semiconductor chip and a lower package substrate, locating an upper semiconductor package on the lower semiconductor package, and pressing the upper semiconductor package to press the thermal interface material composition.

In some embodiments, pressing the upper semiconductor package may include putting a weight on the upper semiconductor package.

In some embodiments, a mass of the weight may be in a range of about 5 g to about 50 g.

In some embodiments, putting the weight on the upper semiconductor package may include covering the upper semiconductor package with a guide, and the weight may pass through a central portion of the guide.

In some embodiments, the weight may be put on the upper semiconductor package so as to cover an entire portion of the lower semiconductor chip.

In some embodiments, the method may further include heating the thermal interface material composition to form a thermal interface material layer while pressing the upper semiconductor package.

In some embodiments, the thermal interface material composition may be pressed to contact about 70% or greater of an area of a top surface of the lower semiconductor chip.

In some embodiments, the method may further include removing the weight after the thermal interface material layer is formed and attaching at least one external solder ball to a bottom surface of the lower package substrate after removing the weight.

According to some embodiments of the present inventive concepts, a method of manufacturing a POP device may include providing a lower semiconductor package including a lower package substrate, a lower semiconductor chip mounted on the lower package substrate, and a lower solder ball that is bonded to a top surface of the lower package substrate and spaced apart from the lower semiconductor chip and providing an upper semiconductor package on the lower semiconductor package. The upper semiconductor package may include an upper package substrate, an upper semiconductor chip mounted on the upper package substrate, and an upper solder ball bonded to a bottom surface of the upper package substrate. The method may also include providing a thermal interface material composition between the lower semiconductor package and the upper semiconductor package and pressing the upper semiconductor package to press the thermal interface material composition.

In some embodiments, the lower semiconductor package may further include a mold layer that may cover a sidewall of the lower semiconductor chip and the lower package substrate and may include a hole exposing the lower solder ball. Providing the upper semiconductor package on the lower semiconductor package may include inserting the upper solder ball into the hole.

In some embodiments, pressing the upper semiconductor package may include putting a weight on the upper semiconductor package.

In some embodiments, putting the weight on the upper semiconductor package may include covering the upper semiconductor package with a guide, and the weight may pass through a central portion of the guide.

In some embodiments, the weight may put on the upper semiconductor package so as to cover an entire portion of the lower semiconductor chip.

In some embodiments, the method may further include heating the thermal interface material composition to form a thermal interface material layer and heating the lower solder ball and the upper solder ball to form a connection solder ball connecting the lower semiconductor package and the upper semiconductor package while pressing the upper semiconductor package.

In some embodiments, the thermal interface material composition may be pressed to contact about 70% or greater of an area of a top surface of the lower semiconductor chip.

According to some embodiments of the present inventive concepts, a method of manufacturing a POP device may include providing a lower semiconductor package including a lower package substrate, a lower semiconductor chip mounted on the lower package substrate, and a lower solder ball that is bonded to a top surface of the lower package substrate and spaced apart from the lower semiconductor chip. The method may also include applying a thermal interface material composition on the lower semiconductor chip and disposing an upper semiconductor package on the lower semiconductor package. The upper semiconductor package may include an upper package substrate, an upper semiconductor chip mounted on the upper package substrate and an upper solder ball bonded to a bottom surface of the upper package substrate. The method may further include pressing and heating the thermal interface material composition to widen a contact area between the thermal interface material composition and the lower semiconductor chip and pressing and heating the lower and upper solder balls to melt the lower and upper solder balls such that the lower and upper solder balls are bonded to each other.

In some embodiments, pressing and heating the thermal interface material composition and the lower solder ball and the upper solder ball may include putting a weight on the upper semiconductor package.

In some embodiments, putting the weight on the upper semiconductor package may include covering the upper semiconductor package with a guide, and the weight may pass through a central portion of the guide.

In some embodiments, pressing and heating the thermal interface material composition may be performed to form a thermal interface material layer, and pressing and heating the lower and upper solder balls may be performed to form a connection solder ball that connects the lower semiconductor package and the upper semiconductor package.

In some embodiments, the contact area between the thermal interface material composition and the lower semiconductor chip may be widened about 70% or greater of an area of a top surface of the lower semiconductor chip.

DETAILED DESCRIPTION

Figure 1:
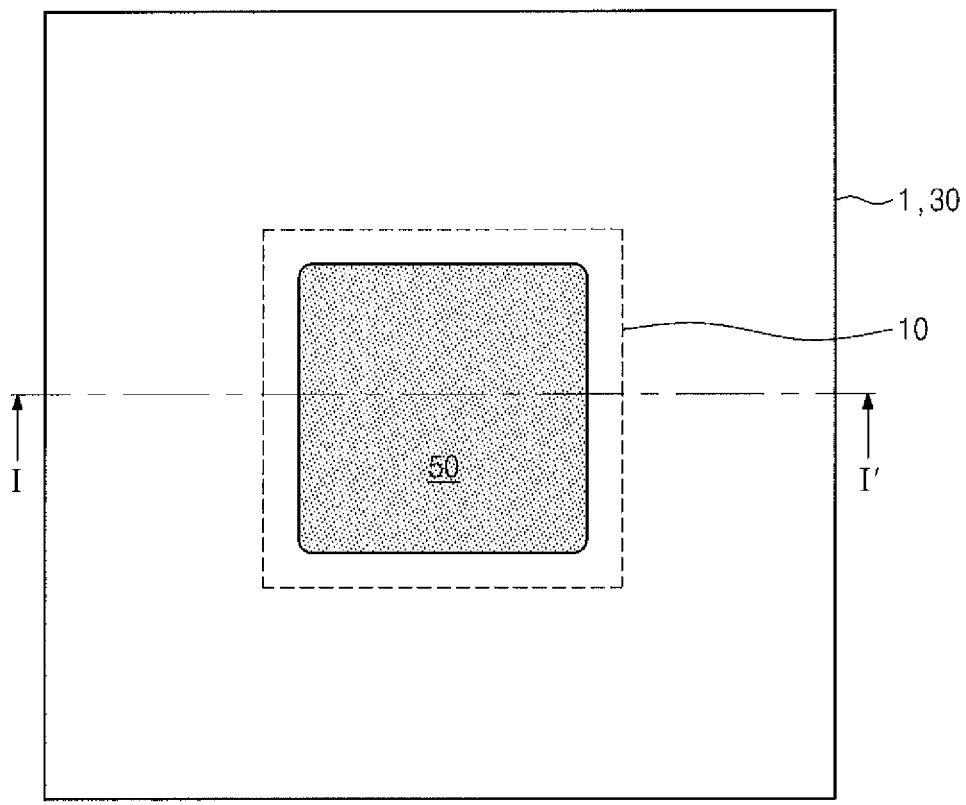
FIG. 1 is a layout illustrating a package-on-package (POP) device according to some embodiments of the present inventive concepts.

The present inventive concepts will now be described hereinafter with reference to the accompanying drawings, in which some embodiments of the present inventive concepts are shown. The advantages and features of the present inventive concepts and methods of achieving them will be apparent from following example embodiments that will be described in more detail with reference to the accompanying drawings. It should be noted, however, that the present inventive concepts are not limited to the example embodiments, and may be implemented in various forms. Accordingly, example embodiments are provided only to disclose the present inventive concepts and let those skilled in the art know the category of the present inventive concepts. In the drawings, embodiments of the present inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, steps, operations, elements, and/or components, but do not preclude the presence or addition of one or more other features, steps, operations, elements, components, and/or groups thereof.

Additionally, some embodiments in the detailed description will be described with sectional views and plan views that are idealized views of the present inventive concepts. Accordingly, shapes of the views may be modified according to manufacturing techniques and/or allowable errors. Therefore, the embodiments of the present inventive concepts are not limited to the specific shape illustrated in the views, but may include other shapes that may be created according to manufacturing processes. Areas exemplified in the drawings have general properties, and are used to illustrate specific shapes of elements. Thus, this should not be construed as limited to the scope of the present inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Some embodiments of aspects of the present inventive concepts explained and illustrated herein include their complementary counterparts. The same reference numerals or the same reference designators denote the same elements throughout the specification.

Moreover, some embodiments are described herein with reference to cross-sectional illustrations or plan illustrations that are idealized illustrations. Accordingly, variations from the shapes of the illustrations as a result, for example, of manufacturing techniques and/or tolerances, are to be expected. Thus, some embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, cross-sectional views illustrated herein may be replicated in two different directions, which need not be orthogonal, in the microelectronic device. Thus, a plan view of the microelectronic devices that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, cross-sectional views illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Figure 2:
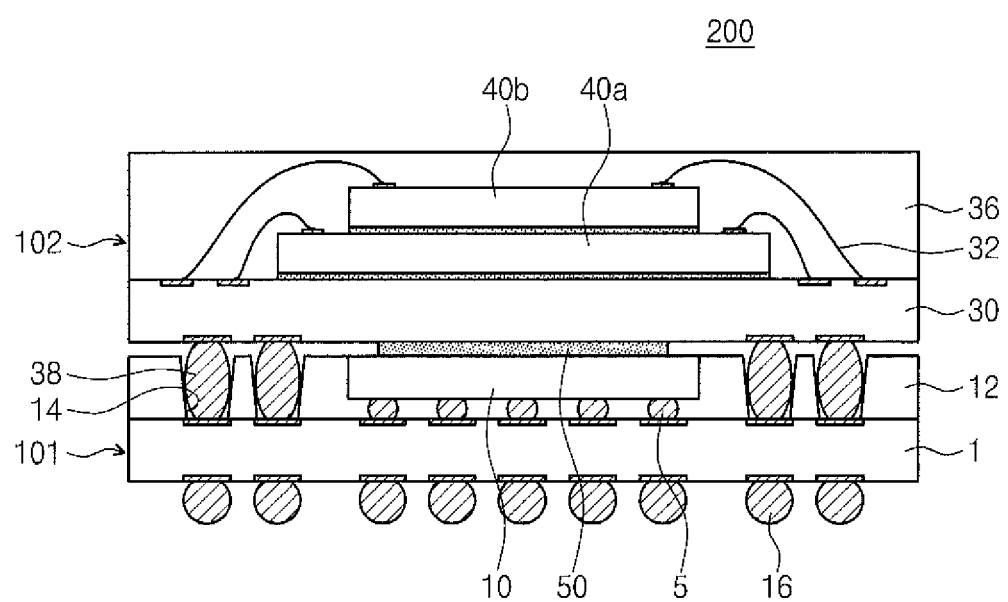
FIG. 2 is a cross-sectional view taken along the line I-I' of FIG. 1.

FIG. 1 is a layout illustrating a package-on-package (POP) device according to some embodiments of the present inventive concepts. FIG. 2 is a cross-sectional view taken along the line of FIG. 1.

Referring to FIGS. 1 and 2, a POP device 200 according to the present embodiment may include a lower semiconductor package 101 and an upper semiconductor package 102 which are sequentially stacked.

The lower semiconductor package 101 may include a lower package substrate 1, a lower semiconductor chip 10 mounted on the lower package substrate 1, and a lower mold layer 12 covering the lower package substrate 1 and the lower semiconductor chip 10. The lower semiconductor chip 10 may be electrically connected to the lower package substrate 1 through internal solder balls 5 and may be mounted on the lower package substrate 1 by a flip chip bonding method. External solder balls 16 may be disposed on a bottom surface of the lower package substrate 1. The lower mold layer 12 may cover a sidewall of the lower semiconductor chip 10 but may expose a top surface of the lower semiconductor chip 10. In other words, the top surface of the lower semiconductor chip 10 may not be covered by the lower mold layer 12. The lower mold layer 12 may include at least one connecting hole 14 spaced apart from the lower semiconductor chip 10. The lower semiconductor chip 10 may be, for example, a logic chip. The lower semiconductor chip 10 may include at least one of various intellectual property (IP) blocks such as a central processor unit (CPU), a graphic processor unit (GPU), and a universal serial bus (USB).

The upper semiconductor package 102 may include an upper package substrate 30, upper semiconductor chips 40a and 40b mounted on the upper package substrate 30, and an upper mold layer 36 covering the upper package substrate 30 and the upper semiconductor chips 40a and 40b. The upper semiconductor chips 40a and 40b may include a first upper semiconductor chip 40a and a second upper semiconductor chip 40b. The upper semiconductor chips 40a and 40b may be electrically connected to the upper package substrate 30 by wires 32. The upper semiconductor chips 40a and 40b may be, for example, memory chips.

The upper semiconductor package 102 may be stacked on the lower semiconductor package 101. The upper and lower semiconductor packages 102 and 101 may be electrically connected to each other through at least one connection solder ball 38. The connection solder ball 38 may be disposed in the connecting hole 14.

A thermal interface material (TIM) layer 50 may be disposed between the lower semiconductor chip 10 and the upper package substrate 30. The thermal interface material layer 50 may be in contact with both the top surface of the lower semiconductor chip 10 and a bottom surface of the upper package substrate 30. In some embodiments, a contact area between the thermal interface material layer 50 and the lower semiconductor chip 10 may be about 70% or greater of an area of the top surface of the lower semiconductor chip 10. In some embodiments, a size of the thermal interface material layer 50 may be about 70% or greater of an area of the top surface of the lower semiconductor chip 10. In some embodiments, the thermal interface material layer 50 may have a thermal conductivity of about 2 W/m·K (watts per meter kelvin) or more. The thermal interface material layer 50 may be a resin layer in which filler particles are dispersed. In some alternative embodiments, the thermal interface material layer 50 may be an adhesive layer. The filler particles may contain a metal.

In the POP device 200, the thermal interface material layer 50 may be disposed between the upper package substrate 30 and the lower semiconductor chip 10 corresponding to the logic chip from which much heat is mainly generated. If the lower semiconductor chip 10 is spaced apart from the upper package substrate 30 without the thermal interface material layer 50, air may exist in a space between the lower semiconductor chip 10 and the upper package substrate 30. A thermal conductivity of a gas such as the air is markedly lower than that of a solid. Thus, if the thermal interface material layer 50 does not exist, it may be difficult to smoothly release the heat generated from the lower semiconductor chip 10. However, the thermal interface material layer 50 may be disposed between the lower semiconductor chip 10 and the upper package substrate 30 in the POP device 200 according to embodiments of the present inventive concepts, and thus, it may be possible to easily release the heat generated from the lower semiconductor chip 10 through the thermal interface material layer 50 and the upper semiconductor package 102. Accordingly, an operating speed of the lower semiconductor chip 10 in the POP device 200 may be improved and false operation of the lower semiconductor chip 10 in the POP device 200 may be reduced or possibly prevented. In addition, a start time of dynamic thermal management (DTM) of the lower semiconductor chip 10 in the POP device 200 may put off, so usage of the central processing unit of the lower semiconductor chip 10 in the POP device 200 may be possibly optimized or maximized.

Experimental Example

Figure 3:
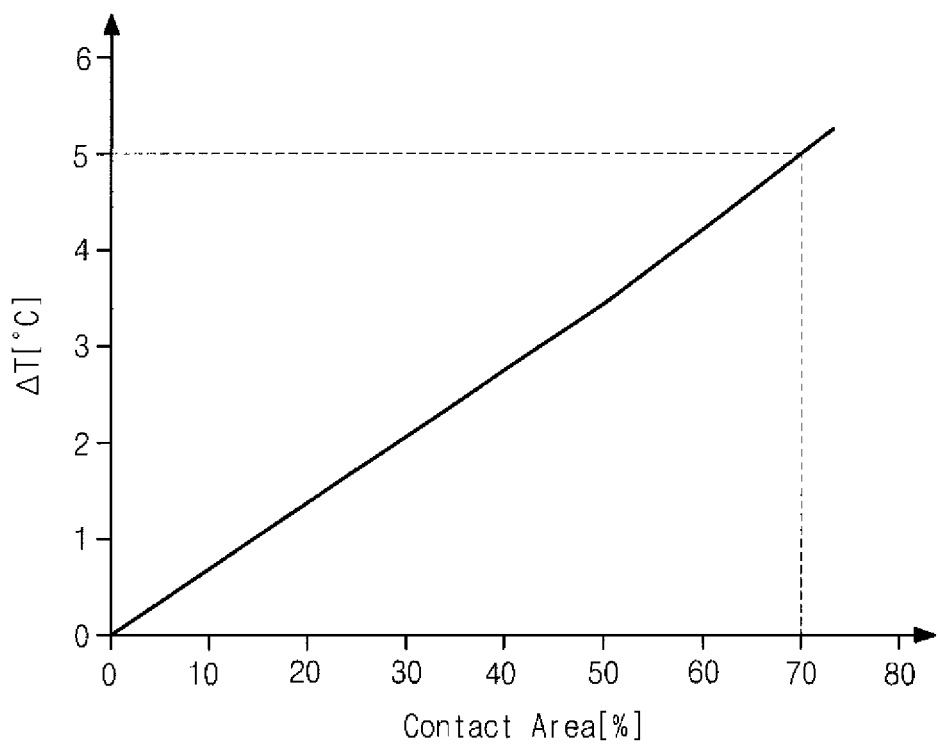
FIG. 3 is a graph illustrating a temperature difference according to a contact area of a thermal interface material layer and a lower semiconductor chip in a POP device.

FIG. 3 is a graph illustrating a temperature difference according to a contact area of a thermal interface material layer and a lower semiconductor chip in a POP device. Several POP devices were manufactured for an experimental example. Each of the manufactured POP devices included a lower semiconductor package of which a lower semiconductor chip had an exposed top surface, and an upper semiconductor package mounted on the lower semiconductor package. A first POP device did not include the thermal interface material layer. Second POP devices included the thermal interface material layers. Thermal conductivities of the thermal interface material layers of the second POP devices were about 2 W/m·K or more. Areas of top surfaces of the lower semiconductor chips of the first and second POP devices were equal. In the first POP device that does not include the thermal interface material layer, a temperature of the lower semiconductor chip was measured when a power of 5 W was supplied to the lower semiconductor chip at a set level. In the second POP devices, contact areas of the thermal interface material layers and the top surfaces of the lower semiconductor chips of the second POP devices were 10%, 20%, 30%, 40%, 50%, 60%, 70% and 80% of the area of the top surface of the lower semiconductor chip, respectively. Temperatures of the lower semiconductor chips of the second POP devices were measured in the same manner as for the first POP device. Thus, a temperature variation according to the contact area was measured. Differences ΔT between the temperature of the lower semiconductor chip of the first POP device and the temperatures of the lower semiconductor chips of the second POP devices were calculated to be illustrated in FIG. 3. The temperature difference ΔT should be equal to or greater than 5° C. to recognize an heat release effect of the POP device when the power of 5 W is supplied to the lower semiconductor chip. Referring to FIG. 3, the temperature difference ΔT is equal to or greater than 5° C. when the contact area of the thermal interface material layer and the lower semiconductor chip is about 70% or greater of the area of the top surface of the lower semiconductor chip. Thus, the heat generated from the lower semiconductor chip may be released with a rate of 1° C./W to effectively improve the heat release effect of the POP device.

FIGS. 4 through 8 and 10 are cross-sectional views illustrating a method of manufacturing a POP device according to some embodiments of the present inventive concepts. FIGS. 9A through 9C are plan views illustrating shapes of an applied thermal interface material composition according to some embodiments of the present inventive concepts.

Figure 4:
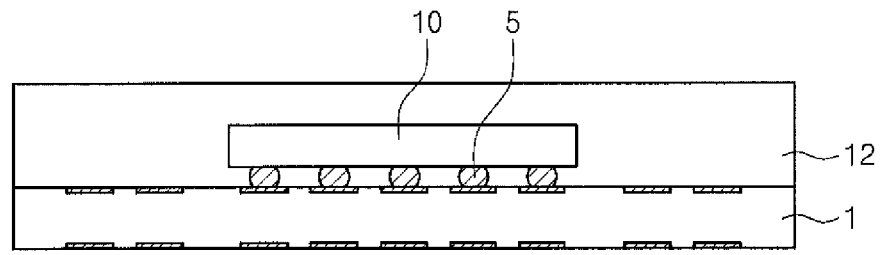
FIGS. 4 through 8 and 10 are cross-sectional views illustrating a method of manufacturing a POP device according to some embodiments of the present inventive concepts.

Referring to FIG. 4, a lower semiconductor chip 10 may be mounted using internal solder balls 5 on a lower package substrate 1 by a flip chip bonding method. Subsequently, a mold process may be performed to form a lower mold layer 12 covering the lower semiconductor chip 10.

Figure 5:
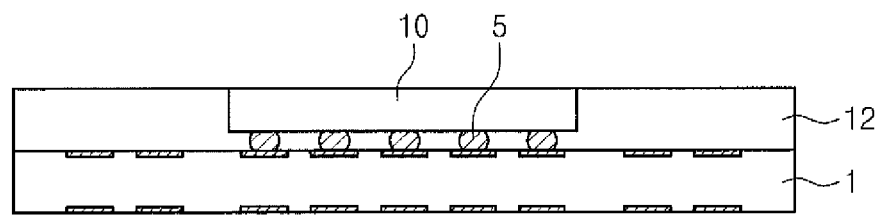

Referring to FIG. 5, a polishing process may be performed to remove at least an upper portion of the lower mold layer 12, so a top surface of the lower semiconductor chip 10 may be exposed. In some embodiments, in the polishing process, an upper portion of the lower semiconductor chip 10 may also be removed, and thus, the lower semiconductor chip 10 may be formed to have a desired thickness.

Alternatively, the lower mold layer 12 may be formed to expose a top surface of the lower semiconductor chip 10 during the mold process without the polishing process.

Figure 6:
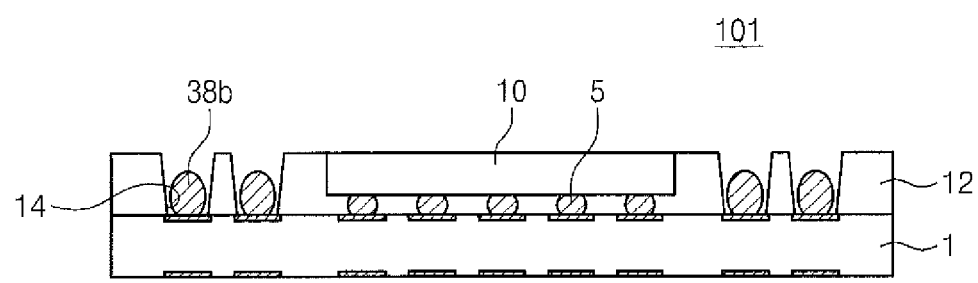

Referring to FIG. 6, at least one connecting hole 14 may be formed using, for example, laser drilling technique in the lower mold layer 12. A lower connection solder ball 38b is formed on the lower package substrate 1 exposed by the connecting hole 14. In other words, the lower connection solder ball 38b is formed in the connecting hole 14. As a result, a lower semiconductor package 101 may be formed.

Figure 7:
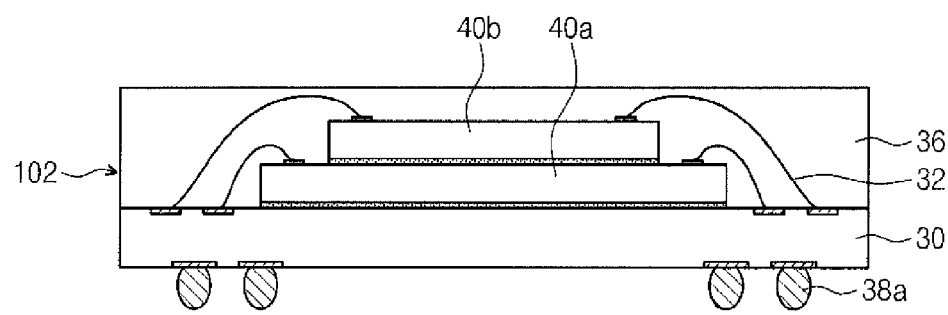

Referring to FIG. 7, a first upper semiconductor chip 40a and a second upper semiconductor chip 40b may be sequentially stacked on an upper package substrate 30. The first and second upper semiconductor chips 40a and 40b may be electrically connected to the upper package substrate 30 by wires 32. A mold process may be performed to form an upper mold layer 36 covering the upper semiconductor chips 40a and 40b. An upper connection solder ball 38a may be bonded to a bottom surface of the upper package substrate 30.

Figure 8:
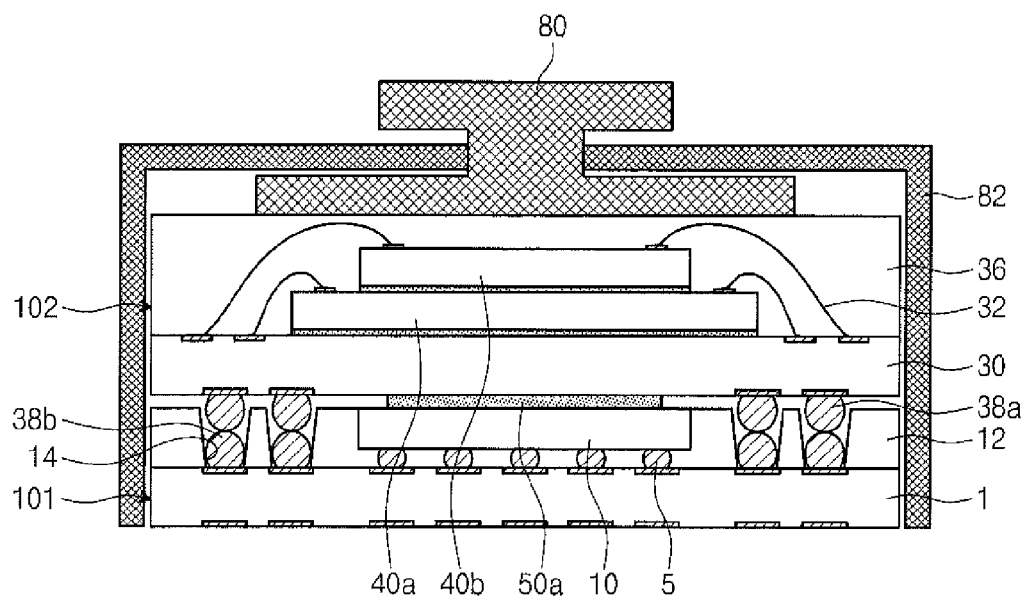
Figure 9A:
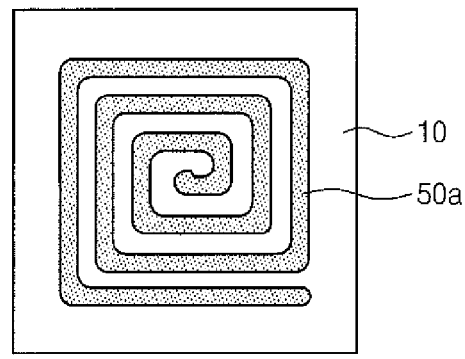
FIGS. 9A through 9C are plan views illustrating shapes of an applied thermal interface material composition according to some embodiments of the present inventive concepts.
Figure 9B:
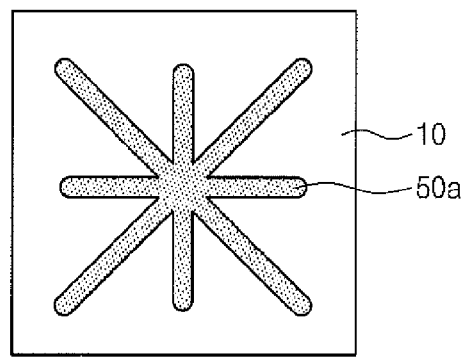
Figure 9C:
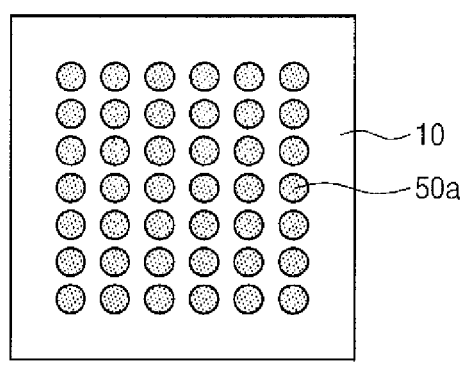

Referring to FIG. 8, a thermal interface material composition 50a may be applied on the lower semiconductor chip 10. For example, a shape of the applied thermal interface material composition 50a may be a spiral shape as shown in FIG. 9A, a star shape as shown in FIG. 9B, or a plurality of dot shapes spaced apart from each other as shown in FIG. 9C. The thermal interface material composition 50a may include a resin solution in which filler particles are dispersed. The upper semiconductor package 102 may be located on the lower semiconductor package 101. At this time, the upper connection solder ball 38a may be inserted into the connecting hole 14 to come in contact with the lower connection solder ball 38b. In this state, a weight 80 may be put on the upper semiconductor package 102. The weight 80 may be inserted into a central portion of a guide 82. The weight 80 may be easily put on a center of the upper semiconductor package 102 by the guide 82. In some embodiments, the weight 80 may cover an entire portion of the lower semiconductor chip 10. The weight 80 should not cause a crack to the upper and lower semiconductor packages 102 and 101 and should not cause a short between connection solder balls 38 adjacent to each other during a reflow process for formation of the connection solder balls 38. To achieve these, the weight 80 should have a suitable mass. In some embodiments, the mass of the weight 80 may be in a range of about 5 g to about 50 g.

Figure 10:
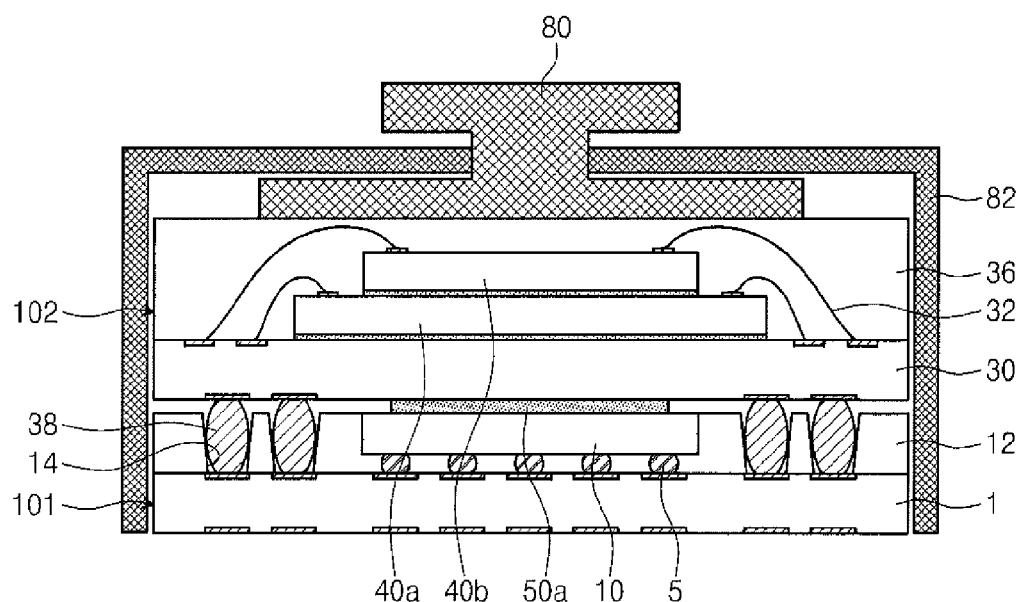

Referring to FIG. 10, the upper and lower connection solder balls 38a and 38b may be heated by performing a reflow process at a temperature equal to or greater than a melting point of the upper and lower connection solder balls 38a and 38b, so they are melted and bonded to each other to form the connection solder ball 38. At this time, the thermal interface material composition 50a may be pressed by the weight 80 to widen a contact area of the thermal interface material composition 50a and the top surface of the lower semiconductor chip 10. In some embodiments, the contact area of the thermal interface material composition 50a and the lower semiconductor chip 10 may be equal to or greater than about 70% of the area of the top surface of the lower semiconductor chip 10. A solvent in the thermal interface material composition 50a may volatilize by heat during the reflow process of the upper and lower connection solder balls 38a and 38b, and thus, a thermal interface material layer 50 may be formed. In some embodiments, the resin included in the thermal interface material composition 50a may be thermosetting resin, and the thermal interface material composition 50a may be hardened to form the thermal interface material layer 50 by the heat during the reflow process. The contact area of the thermal interface material layer 50 and the lower semiconductor chip 10 may be equal to or greater than 70% of the area of the top surface of the lower semiconductor chip 10. Alternatively, a size of the thermal interface material layer 50 may be substantially equal to or greater than 70% of the area of the top surface of the lower semiconductor chip 10.

Referring again to FIG. 2, subsequently, the guide 82 and the weight 80 may be removed from the upper and lower semiconductor packages 102 and 101. External solder balls 16 may be bonded to a bottom surface of the lower package substrate 1. Since the external solder balls 16 may be bonded after the removal of the weight 80, it may be possible to reduce or possibly prevent a short between the external solder balls 16. If the external solder balls 16 is bonded to the bottom surface of the lower package substrate 1 before the weight 80 is put on the upper semiconductor package 102, the external solder balls 16 may be reflowed by the heat during the reflow process of the upper and lower connection solder balls 38a and 38b and may be pressed by the weight 80, thereby coming in contact with each other.

In some embodiments, when the thermal interface material composition 50a may be applied for the formation of the thermal interface material layer 50 during the manufacturing process described above, the thermal interface material layer 50 may be formed of an adhesive layer. The contact area of the thermal interface material layer 50 and the lower semiconductor chip 10 may be substantially equal to or greater than 70% of the area of the top surface of the lower semiconductor chip 10 even though the thermal interface material layer 50 is formed of the adhesive layer.

FIGS. 11 through 16 are cross-sectional views illustrating POP devices according to some embodiments of the present inventive concepts.

Figure 11:
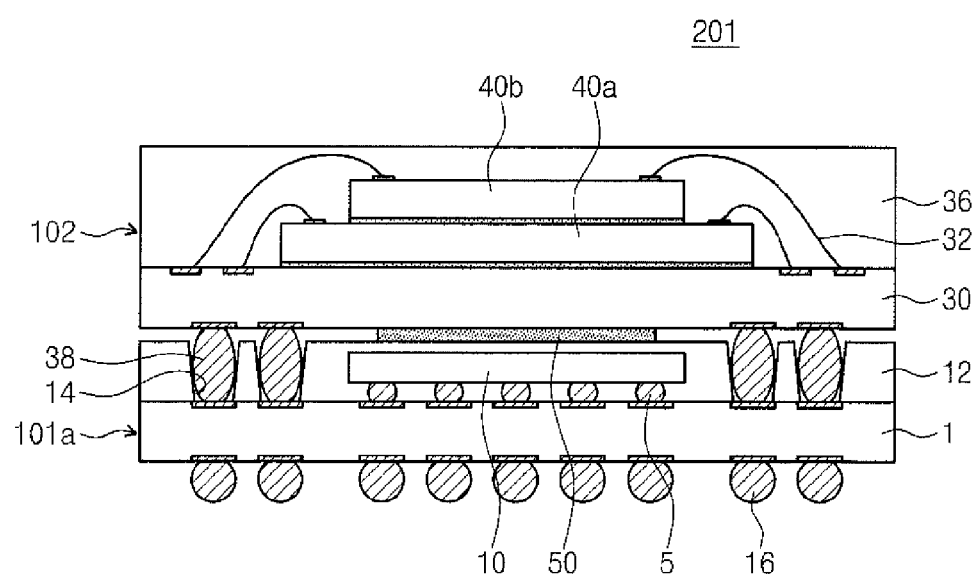
FIGS. 11 through 16 are cross-sectional views illustrating POP devices according to some embodiments of the present inventive concepts.

Referring to FIG. 11, in a POP device 201 according to some embodiments of the present inventive concepts, a top surface of a lower semiconductor chip 10 of a lower semiconductor package 101a may be covered by a lower mold layer 12. A thermal interface material layer 50 may be spaced apart from the lower semiconductor chip 10 and may be in contact with both a top surface of the lower mold layer 12 and a bottom surface of the upper package substrate 30. In some embodiments, an overlapping area of the thermal interface material layer 50 and the top surface of the lower semiconductor chip 10 may be substantially equal to or greater than 70% of the area of the top surface of the lower semiconductor chip 10. Since the thermal interface material layer 50 may be very adjacent to the lower semiconductor chip 10 even though it may be spaced apart from the lower semiconductor chip 10, the heat release effect described with reference to FIG. 2 may be obtained by the thermal interface material layer 50.

Figure 12:
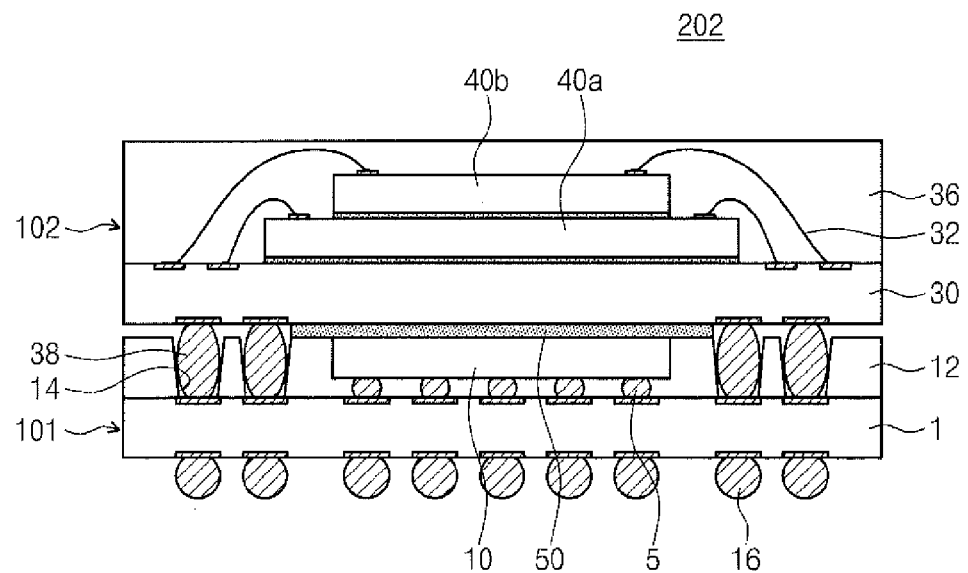

Referring to FIG. 12, in a POP device 202 according to some embodiments of the present inventive concepts, a thermal interface material layer 50 may laterally extend to be in contact with a top surface of the lower mold layer 12 as well as the top surface of the lower semiconductor chip 10.

Figure 13:
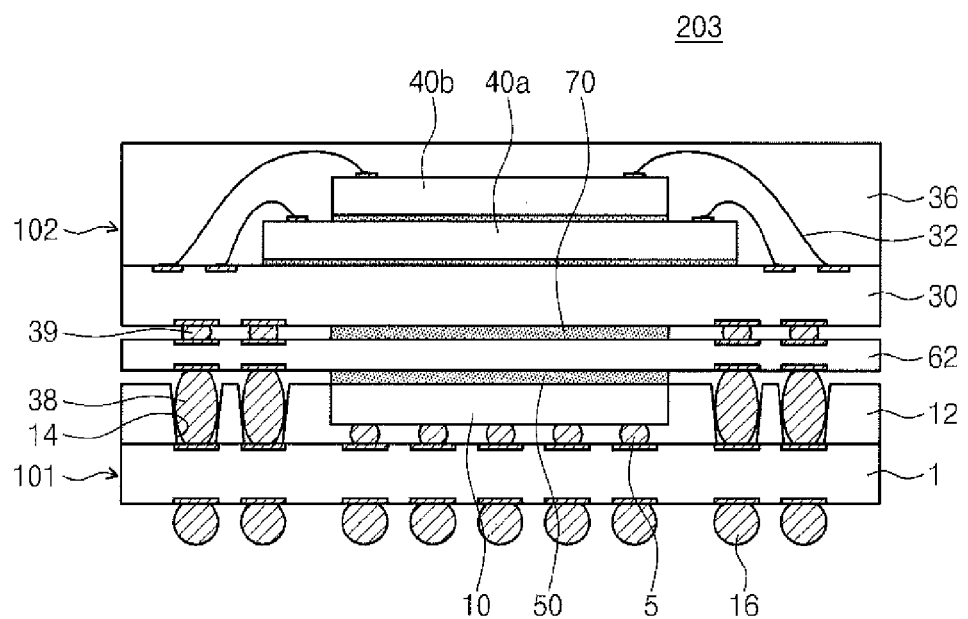

Referring to FIG. 13, in a POP device 203 according to some embodiments of the present inventive concepts, an interposer substrate 62 may be disposed between the lower semiconductor package 101 and the upper semiconductor package 102. The lower semiconductor package 101 may be electrically connected to the interposer substrate 62 through first connection solder balls 38, and the upper semiconductor package 102 may be electrically connected to the interposer substrate 62 through second connection solder balls 39. The interposer substrate 62 may be a printed circuit board and may be formed of, for example, plastic, a flexible film, or ceramic. A first thermal interface material layer 50 may be disposed between the interposer substrate 62 and the lower semiconductor package 101, and a second thermal interface material layer 70 may be disposed between the interposer substrate 62 and the upper semiconductor package 102. The first and second thermal interface material layers 50 and 70 may be the same as the thermal interface material layer 50 discussed with reference to FIGS. 1 and 2. The weight 80 and the guide 82 as shown in FIG. 8 may be applied to a method of manufacturing the POP device 203 of FIG. 13, and thus, contact areas or sizes of the first and second thermal interface material layers 50 and 70 may be increased.

Figure 14:
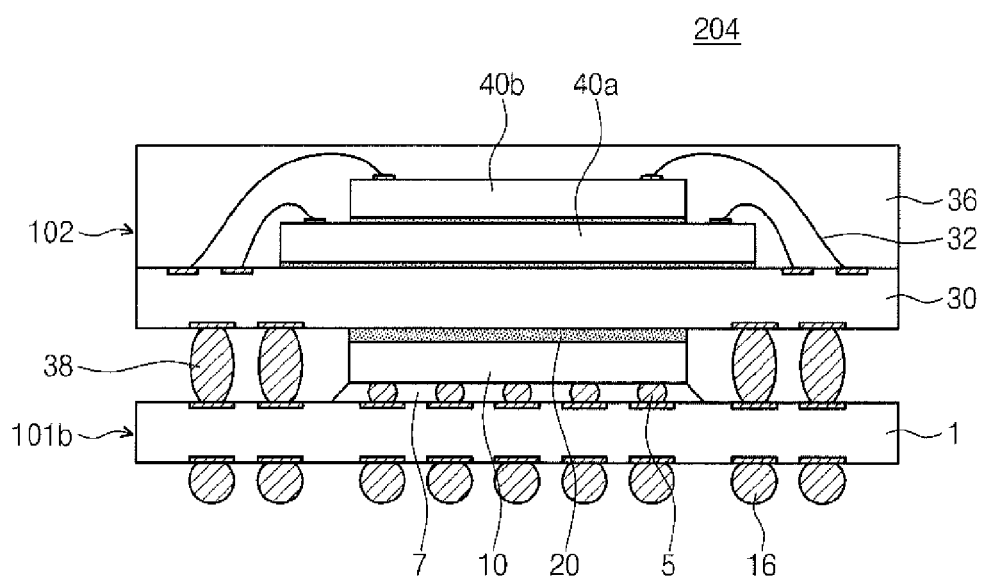

Referring to FIG. 14, in a POP device 204 according to some embodiments of the present inventive concepts, a lower semiconductor package 101b may not include the lower mold layer 12 illustrated in FIG. 2. Instead of the lower mold layer 12, an under-fill resin layer 7 may be disposed between the lower semiconductor chip 10 and the lower package substrate 1 in the POP device 204. When the POP device 204 of FIG. 14 is manufactured, the connection solder ball 38 may be formed by melting and bonding the upper and lower connection solder balls 38a and 38b, as described with reference to FIG. 8. Alternatively, an additional connection solder ball 38 may be formed and bonded between the lower and upper semiconductor packages 101 and 102.

Figure 15:
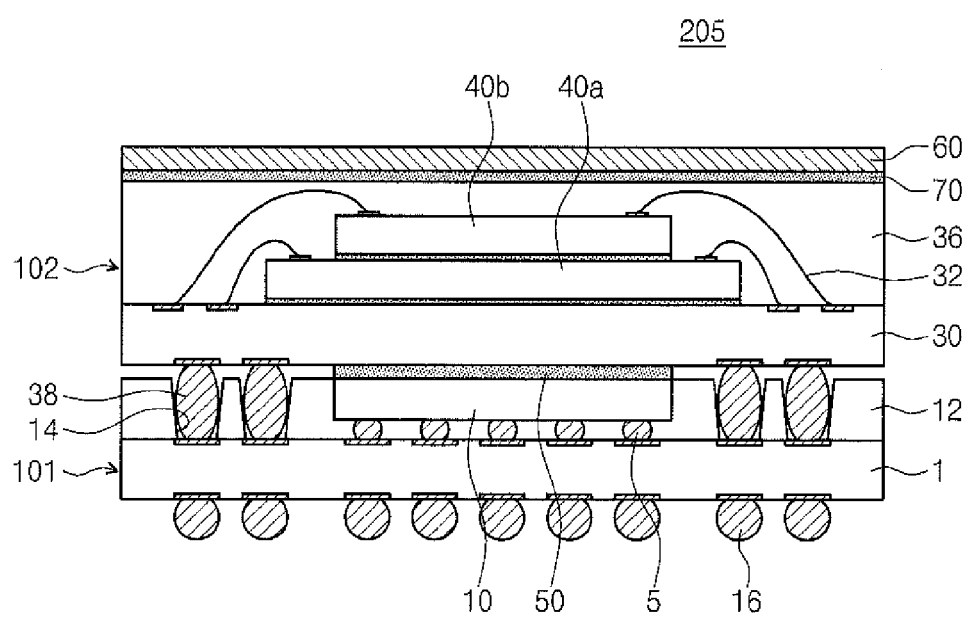

Referring to FIG. 15, in a POP device 205 according to some embodiments of the present inventive concepts, a first thermal interface material layer 50 may be disposed between an upper semiconductor package 102 and a lower semiconductor package 101. The first thermal interface material layer 50 may be the same as discussed with reference to FIG. 2. A second thermal interface material layer 70 and a heat-radiating plate 60 may be sequentially stacked on the upper semiconductor package 102. The second thermal interface material layer 70 may be the same as the first thermal interface material layer 50. The heat-radiating plate 60 may be a metal plate or a flexible metal tape. The weight 80 and the guide 82 as shown in FIG. 8 may be applied to a method of manufacturing the POP device 205 of FIG. 15, so contact areas or sizes of the first and second thermal interface material layers 50 and 70 may be increased.

Figure 16:
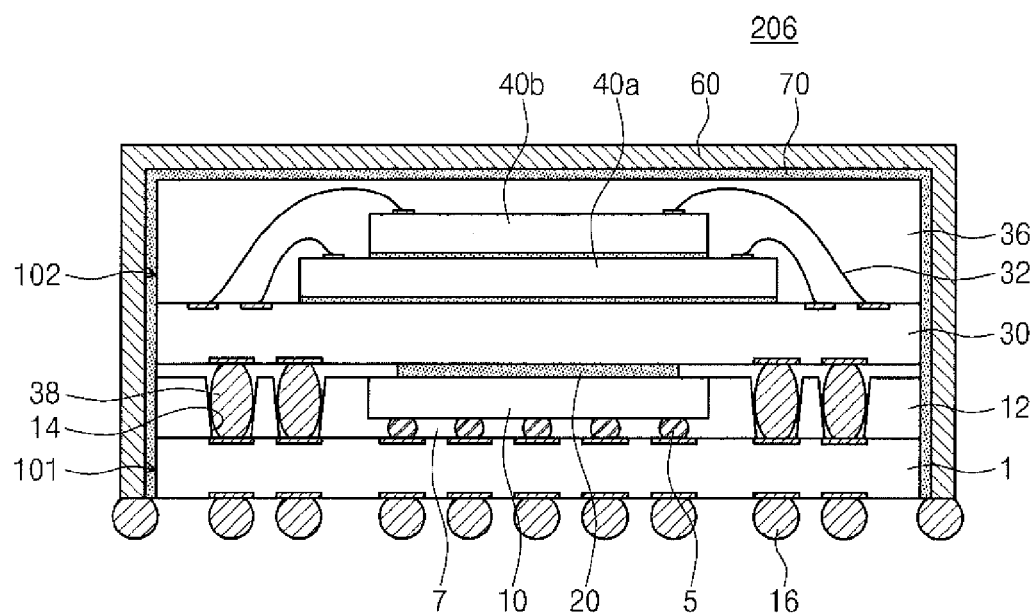

Referring to FIG. 16, in a POP device 206 according to some embodiments of the present inventive concepts, a second thermal interface material layer 70 and a heat-radiating plate 60 may extend to cover sidewalls of upper and lower semiconductor packages 102 and 101. At least one of external solder balls 16 may also be bonded to a bottom surface of the heat-radiating plate 60. In this case, the heat release effect may be more increased. The heat-radiating plate 60 may have a function of shielding electromagnetic interference (EMI) as well as the heat-radiating function. Thus, false operation of the semiconductor packages 101 and 102 may be reduced or possibly prevented.

Figure 17:
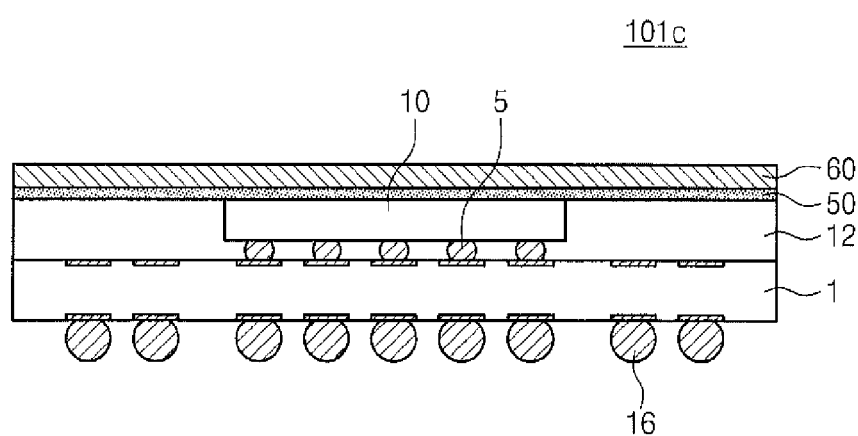
FIG. 17 is a cross-sectional view illustrating a semiconductor package according to some embodiments of the present inventive concepts.

FIG. 17 is a cross-sectional view illustrating a semiconductor package according to some embodiments of the present inventive concepts.

Referring to FIG. 17, a semiconductor package 101c according to some embodiments may be similar to the lower semiconductor package 101 of FIG. 2. The semiconductor package 101c may include a semiconductor chip 10 mounted on a package substrate 1 by a flip chip bonding method, and a mold layer 12 covering a sidewall of the semiconductor chip 10. A thermal interface material layer 50 and a heat-radiating plate 60 may be sequentially stacked on top surfaces of the semiconductor chip 10 and the mold layer 12. When the semiconductor package 101c is manufactured, the weight 80 as shown in FIG. 8 may be put on the heat-radiating plate 60 to increase or widen a contact area of the thermal interface material layer 50 and the top surface of the semiconductor chip 10.

The semiconductor package techniques described above may be applied to various kinds of semiconductor devices and package modules including the various kinds of semiconductor devices.

Figure 18:
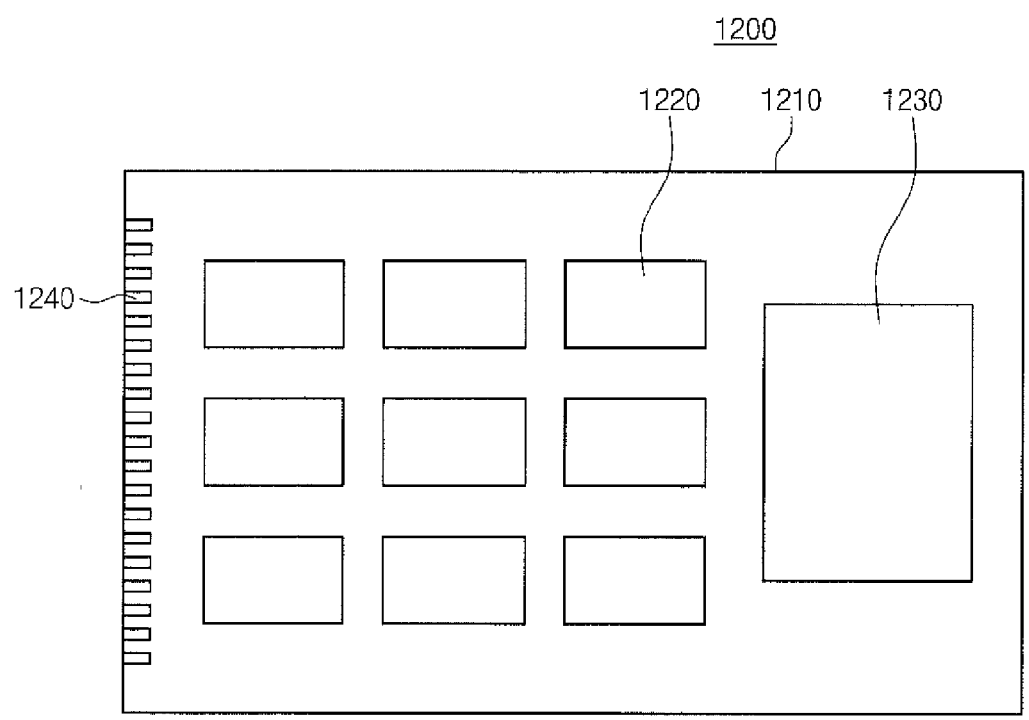
FIG. 18 illustrates an example of package modules including POP devices according to some embodiments of the present inventive concepts.

FIG. 18 illustrates an example of package modules including POP devices according to some embodiments of the present inventive concepts. Referring to FIG. 18, a package module 1200 may include first semiconductor integrated circuit chips 1220 and a second semiconductor integrated circuit chip 1230 packaged using a quad flat package (QFP) technique. The first and second semiconductor integrated circuit chips 1220 and 1230 to which the semiconductor package technique according to some embodiments of the present inventive concepts is applied may be installed on a module board 1210 to form the package module 1200. The package module 1200 may be connected to an external electronic device through external connection terminals 1240 provided on a side of the module board 1210.

Figure 19:
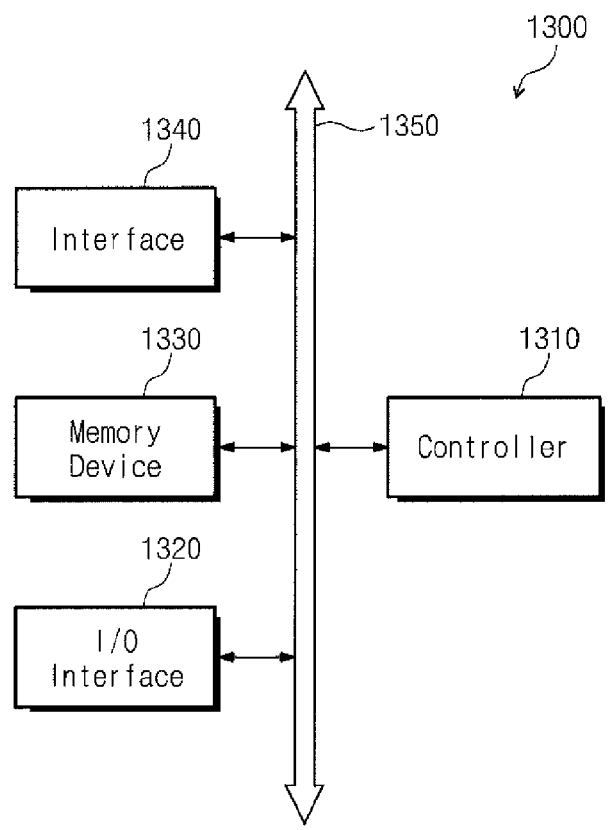
FIG. 19 is a schematic block diagram illustrating an example of electronic systems including POP devices according to some embodiments of the present inventive concepts.

The semiconductor package technique described above may be applied to an electronic system. FIG. 19 is a schematic block diagram illustrating an example of electronic systems including POP devices according to some embodiments of the present inventive concepts. Referring to FIG. 19, an electronic system 1300 may include a controller 1310, an input/output (I/O) interface unit 1320, and a memory device 1330. The controller 1310, the I/O interface unit 1320, and the memory device 1330 may communicate with each other through a data bus 1350. The data bus 1350 may correspond to a path through which electrical signals are transmitted. For example, the controller 1310 may include at least one of a microprocessor, a digital signal processor, a microcontroller, and other logic devices having a similar function to any one thereof. Each of the controller 1310 and the memory device 1330 may include at least one of the semiconductor packages according to some embodiments of the present inventive concepts. The I/O interface unit 1320 may include at least one of a keypad, a keyboard, or a display unit. The memory device 1330 may be a device storing data. The memory device 1330 may store data and/or commands executed by the controller 1310. The memory device 1330 may include a volatile memory device and/or a non-volatile memory device. In some embodiments, the memory device 1330 may include a flash memory device. For example, the flash memory device formed using the technique according to some embodiments of the present inventive concepts may be installed in an information processing system such as a mobile device or a desk top computer. The flash memory device may be realized as a solid state drive (SSD). In this case, the electronic system 1300 may stably store massive data in the memory device 1330. The electronic system 1300 may further include an interface unit 1340 that transmits electrical data to a communication network or receives electrical data from a communication network. The interface unit 1340 may operate by wireless or cable. For example, the interface unit 1340 may include an antenna for wireless communication or a wireless/cable transceiver. In some embodiments, the electronic system 1300 may further include an application chipset and/or a camera image processor (CIS).

The electronic system 1300 may be realized as a mobile system, a personal computer, an industrial computer, or a multi-functional logic system performing various functions. For example, the mobile system may be one of a personal digital assistant (PDA), a portable computer, a web tablet, a wireless phone, a mobile phone, a laptop computer, a digital music player, a memory card, or an information transmitting/receiving system. If the electronic system 1300 is an apparatus capable of performing a wireless communication, the electronic device 1300 may be used in a communication interface protocol such as a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, or MMDS.

Figure 20:
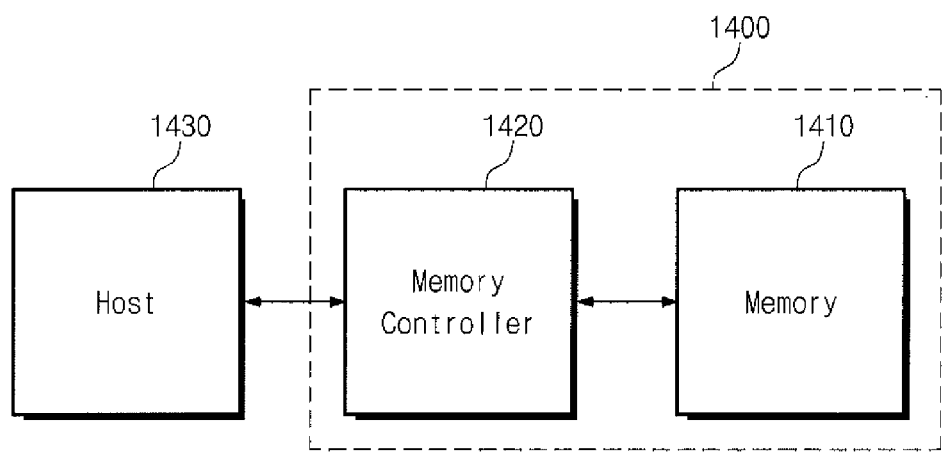
FIG. 20 is a schematic block diagram illustrating an example of memory system including POP devices according to some embodiments of the present inventive concepts.

The semiconductor devices according to some embodiments of the present inventive concepts may be applied to a memory system. The memory system may include a memory card, or a solid state drive (SSD). FIG. 20 is a schematic block diagram illustrating an example of memory system including POP devices according to some embodiments of the present inventive concepts. Referring to FIG. 20, a memory system 1400 may include a memory device 1410 and a memory controller 1420. The memory device 1410 may be a non-volatile memory device. The memory device 1410 and the memory controller 1420 may store data or may read stored data. The memory device 1410 may include at least one of non-volatile memory devices to which the semiconductor package techniques according to some embodiments of the present inventive concepts are applied. The memory controller 1420 may read data from/store data into the memory device 1410 in response to read/write request of a host 1430.

In the POP device according to some embodiments of the present inventive concepts, since the thermal interface material layer between the lower and upper semiconductor packages may be in contact with about 70% or greater of the area of the top surface of the lower semiconductor chip, the heat generated from the lower semiconductor chip may be released with the rate of 1° C./W to effectively improve the heat release effect of the POP device. As a result, the operating speed of the semiconductor chip in the POP device may be improved and the false operation of the semiconductor chip in the POP device may be reduced or possibly prevented.

In the method of manufacturing the POP device according to some embodiments of the present inventive concepts, the thermal interface material composition may be located between the lower and upper semiconductor packages, and then the upper semiconductor package may be pressed to form the connection solder ball electrically connecting the upper and lower semiconductor packages to each other. The thermal interface material composition may be pressed by the upper semiconductor package, and thus the thermal interface material composition may be spread to come in contact with about 70% or greater of the area of the top surface of the lower semiconductor chip. As a result, the POP device with the improved heat release effect may be manufactured. In addition, the weight of about 5 g to about 50 g may be put on the upper semiconductor package to press the upper semiconductor package, so the crack may not be caused to the upper and lower semiconductor packages and the thermal interface material composition may be suitably pressed.

The above-disclosed subject matter is to be considered illustrative, and not restrictive, and the appended claims are intended to cover all such modifications, enhancements, and other embodiments, which fall within the true spirit and scope of the present inventive concepts. Thus, to the maximum extent allowed by law, the scope is to be determined by the broadest permissible interpretation of the following claims and their equivalents, and shall not be restricted or limited by the foregoing detailed description.

What is claimed is:

1. A method of manufacturing a package-on-package (POP) device, the method comprising:
applying a thermal interface material composition on a lower semiconductor package including a lower semiconductor chip and a lower package substrate, wherein the thermal interface material composition has a thermal conductivity and comprises a resin layer and filler particles comprising a metal that are dispersed in the resin layer;
placing an upper semiconductor package on the lower semiconductor package; and
pressing the upper semiconductor package toward the lower semiconductor package to press the thermal interface material composition,
wherein pressing the upper semiconductor package comprises putting a weight on the upper semiconductor package to press the upper semiconductor package toward the lower semiconductor package by a mass of the weight such that the thermal interface material composition is pressed,
wherein putting the weight on the upper semiconductor package comprises placing the lower and the upper semiconductor packages in a guide comprising a vertical portion that is proximate to and aligned with sidewalls of the lower and upper semiconductor packages and a horizontal portion that is over and substantially parallel to the upper semiconductor package,
wherein the horizontal portion of the guide comprises a hole at a central portion thereof, and
wherein the weight comprises a protruding portion that extends through the hole of the guide.

2. The method of claim 1, wherein the mass of the weight is in a range of about 5 g to about 50 g.

3. The method of claim 1, wherein the weight is put on the upper semiconductor package so as to cover an entire portion of the lower semiconductor chip.

4. The method of claim 1, further comprising:
heating the thermal interface material composition to form a thermal interface material layer while pressing the upper semiconductor package.

5. The method of claim 4, wherein the thermal interface material composition is pressed to contact about 70% or greater of an area of a top surface of the lower semiconductor chip.

6. A method of manufacturing a package-on-package (POP) device, the method comprising:
providing a lower semiconductor package including a lower package substrate, a lower semiconductor chip mounted on the lower package substrate, and a lower solder ball that is bonded to a top surface of the lower package substrate and spaced apart from the lower semiconductor chip;
providing a thermal interface material composition on the lower semiconductor package, wherein the thermal interface material composition has a thermal conductivity and comprises a resin layer and filler particles comprising a metal that are dispersed in the resin layer;
providing an upper semiconductor package on the lower semiconductor package, the upper semiconductor package including an upper package substrate, an upper semiconductor chip mounted on the upper package substrate, and an upper solder ball bonded to a bottom surface of the upper package substrate, wherein the thermal interface material composition is between the lower semiconductor package and the upper semiconductor package; and
pressing the upper semiconductor package toward the lower semiconductor package,
wherein pressing the upper semiconductor package comprises putting a weight on the upper semiconductor package to press the upper semiconductor package toward the lower semiconductor package by a mass of the weight such that the thermal interface material composition is pressed,
wherein putting the weight on the upper semiconductor package comprises placing the lower and the upper semiconductor packages in a guide comprising a vertical portion that is proximate to and aligned with sidewalls of the lower and upper semiconductor packages and a horizontal portion that is over and substantially parallel to the upper semiconductor package;
wherein the horizontal portion of the guide comprises a hole at a central portion thereof, and
wherein the weight comprises a protruding portion that extends through the hole of the guide.

7. The method of claim 6, wherein:
the lower semiconductor package further comprises a mold layer that covers a sidewall of the lower semiconductor chip and the lower package substrate and includes a hole exposing the lower solder ball; and
providing the upper semiconductor package on the lower semiconductor package comprises inserting the upper solder ball into the hole.

8. The method of claim 6, wherein the weight is put on the upper semiconductor package so as to cover an entire portion of the lower semiconductor chip.

9. The method of claim 6, further comprising:
heating the thermal interface material composition to form a thermal interface material layer and heating the lower solder ball and the upper solder ball to form a connection solder ball connecting the lower semiconductor package and the upper semiconductor package while pressing the upper semiconductor package.

10. The method of claim 9, wherein the thermal interface material composition is pressed to contact about 70% or greater of an area of a top surface of the lower semiconductor chip.

11. A method of manufacturing a package-on-package (POP) device, the method comprising:
providing a lower semiconductor package including a lower package substrate, a lower semiconductor chip mounted on the lower package substrate, and a lower solder ball that is bonded to a top surface of the lower package substrate and spaced apart from the lower semiconductor chip;
applying a thermal interface material composition on the lower semiconductor chip, wherein the thermal interface material composition has a thermal conductivity and comprises a resin layer and filler particles comprising a metal that are dispersed in the resin layer;
providing an upper semiconductor package on the lower semiconductor package and the thermal interface material composition, the upper semiconductor package including an upper package substrate, an upper semiconductor chip mounted on the upper package substrate, and an upper solder ball bonded to a bottom surface of the upper package substrate; and
pressing and heating the thermal interface material composition to widen a contact area between the thermal interface material composition and the lower semiconductor chip and pressing and heating the lower and the upper solder balls to melt the lower and the upper solder balls such that the lower and upper solder balls are bonded to each other, wherein the thermal interface material composition is between the lower semiconductor package and the upper semiconductor package, wherein pressing and heating the thermal interface material composition comprises putting a weight on the upper semiconductor package to press the upper semiconductor package toward the lower semiconductor package by a mass of the weight such that the thermal interface material composition is pressed, wherein putting the weight on the upper semiconductor package comprises placing the lower and the upper semiconductor packages in a guide comprising a vertical portion that is proximate to and aligned with sidewalls of the lower and upper semiconductor packages and a horizontal portion that is over and substantially parallel to the upper semiconductor package;

wherein the horizontal portion of the guide comprises a hole at a central portion thereof; and wherein the weight comprises a protruding portion that extends through the hole of the guide.

12. The method of claim 11, wherein:
pressing and heating the thermal interface material composition is performed to form a thermal interface material layer; and
pressing and heating the lower and upper solder balls is performed to form a connection solder ball that connects the lower semiconductor package and the upper semiconductor package.

13. The method of claim 11, wherein the contact area between the thermal interface material composition and the lower semiconductor chip is widened about 70% or greater of an area of a top surface of the lower semiconductor chip.

14. The method of claim 1, wherein the thermal interface material composition has a thermal conductivity of at least 2 W/m·K.

* * * * *